United States Patent
Lee

(10) Patent No.: US 8,362,812 B2
(45) Date of Patent: Jan. 29, 2013

(54) SWITCHING GATE DRIVER

(75) Inventor: Jae Moon Lee, Cheonan (KR)

(73) Assignee: LSIS Co., Ltd., Anyang-si, Gyeonggi-Do (KR)

( * ) Notice: Subject to any disclaimer, the term of this patent is extended or adjusted under 35 U.S.C. 154(b) by 5 days.

(21) Appl. No.: 13/098,287

(22) Filed: Apr. 29, 2011

(65) Prior Publication Data

US 2011/0273206 A1    Nov. 10, 2011

(30) Foreign Application Priority Data

May 6, 2010   (KR) .......................... 10-2010-0042661

(51) Int. Cl.
*H03K 3/00* (2006.01)

(52) U.S. Cl. ........................................................ 327/109

(58) Field of Classification Search .................... None
See application file for complete search history.

(56) References Cited

U.S. PATENT DOCUMENTS

| 7,034,566 B2 * | 4/2006 | Cranford et al. ................ 326/30 |
| 7,206,179 B2 * | 4/2007 | Miyamoto .................... 361/118 |

FOREIGN PATENT DOCUMENTS

| JP | 05336732 | 12/1993 |
| JP | 06291631 | 10/1994 |
| JP | 10023743 | 1/1998 |
| JP | 2002125363 | 4/2002 |

* cited by examiner

*Primary Examiner* — Lincoln Donovan
*Assistant Examiner* — Sibin Chen
(74) *Attorney, Agent, or Firm* — Lee, Hong, Degerman, Kang & Waimey

(57) ABSTRACT

Disclosed is a switching gate driver of an IGBT device, including a resistor unit to control a gate current of the IGBT device; and a voltage reader that outputs a control signal to control a variable resistor unit of the resistor unit to the resistor unit, according to a collector-emitter voltage of the IGBT device.

6 Claims, 9 Drawing Sheets

SWITCHING GATE DRIVER

Pursuant to 35 U.S.C. §119 (a), this application claims the benefit of earlier filing date and right of priority to Korean Patent Application No. 10-2010-0042661, filed on May 6, 2010, the contents of which are hereby incorporated by reference in their entirety.

BACKGROUND OF THE DISCLOSURE

1. Field of the Invention

The present disclosure relates to a switching gate driver which is included to drive an inverter, and more particularly, to a switching gate driver to reduce an On/Off switching stress.

2. Description of the Related Art

An inverter is a device that converts an AC voltage to a DC voltage, generates an AC voltage when a switching device switches the converted DC voltage according to a PWM (Pulse Width Modulation) signal, and outputs the generated AC voltage to a load to be driven. It provides the load with an AC voltage having voltage and frequency required by a user so that the driving of the load can be precisely controlled.

An IGBT (Insulated Gate Bipolar Transistor) is normally used as a switching device included in the inverter. A switching gate driver is a circuit that controls the IGBT or MOS transistor.

FIG. 1 is a circuit diagram illustrating a gate driver. A gate driver to control most of IGBT devices used in the industry has the same construction as that illustrated in FIG. 1.

Referring to FIG. 1, the gate deriver includes gate resistors RG(on), RG(off), Rin and RGE, a capacitor C, and 2 switching devices, in order to switch an IGBT device. The gate driver receives an IGBT control signal, converts a signal into voltage levels VG+ and VG− appropriate to drive the IGBT and charges/discharges the gate of the IGBT device through the gate resistors RG(on) and RG(off). The gate voltage Vge of the IGBT device is applied according to the amount of charge accumulated at the IGBT gate, and the IGBT is turned on when the gate voltage Vge becomes higher than the driving voltage of the IGBT device.

When the gate voltage Vge of the IGBT device becomes equal to or less than the driving voltage, the IGBT device is turned off. At this time, the turn-on and turn-off time of the IGBT device is determined by the magnitudes of the resistors RG(on) and RG(off). When designing the gate resistors RG(on) and RG(off) in a small magnitude, a large spike voltage occurs between collector and emitter terminals of the IGBT device in a turn-off operation of the IGBT device due to a sudden current change occurring when the IGBT device is switched, and a large reverse recovery current of a freewheeling diode occurs in the turn-on operation of the IGBT device. On the other hand, when designing the gate resistors RG(on) and RG(off) in a large magnitude, current change time becomes long so that a switching loss is increased.

FIGS. 2 to 5 are circuit diagrams illustrating a variety of embodiments of the gate driver illustrated in FIG. 1.

FIG. 2 illustrates a case that includes resistors RG(on) and RG(off), and FIG. 3 illustrates a case that embodies resistors RG(on) and RG(off) as one resistor. FIG. 3 illustrates a charge current path when the IGBT device is turned on, and FIG. 4 illustrates a discharge current path when the IGBT device is turned off.

As described above, the gate driver in the art is constructed of a MOS transistor providing the IGBT device with a driving power or a totem-pole circuit, and a gate resistor RG that controls an IGBT gate charge/discharge current. The gate resistor RG may be separately constructed of a gate resistor RG(on) that controls the gate charge current of the IGBT device when the IGBT device is turned on and a gate resistor RG(off) that controls the gate discharge current of the IGBT device when the IGBT device is turned off, as illustrated in FIG. 2, or may be constructed of one gate resistor without dividing turn on/turn off operations of the IGBT device, as illustrated in FIG. 3.

The gate charge/discharge current of the IGBT device is charged through the gate resistor RG(on) when the IGBT device is turned on, as illustrated in FIG. 4 and discharged through the gate resistor RG(off) when the IGBT device is turned off, as illustrated in FIG. 5. The gate resistor RG is predetermined as an appropriate value in consideration of an IGBT spike voltage occurring when the IGBT device is turned off, a reverse recovery current of a freewheeling diode occurring when the IGBT device is turned on, and a switching loss.

The spike voltage of the IGBT device determined by the gate resistor RG and the reverse recovery current of a freewheeling diode have a complementary relationship with respect to a switching loss. At this time, when the gate resistor RG is designed too large, gate charge/discharge time for the IGBT becomes long, and an IGBT spike voltage of a collector-emitter voltage Vce of the IGBT device occurring when the IGBT device is turned off or turned on and a reverse recovery current of a freewheeling diode are decreased. However, a switching loss is increased.

When designing the gate resistor RG to be small, gate charge/discharge time for the IGBT device becomes short so that a switching loss is decreased. However, an IGBT spike voltage of a collector-emitter voltage Vce of the IGBT device and a reverse recovery current of a freewheeling diode are increased. Since the gate resistor RG uses a fixed value designed, gate charge/discharge time of the IGBT device is constant.

SUMMARY OF THE INVENTION

The present disclosure provides a switching gate driver that includes a variable resistor in place of a resistor included in a gate terminal of an IGBT device.

According to an aspect of the present disclosure, there is provided a switching gate driver of an IGBT device, comprising a resistor unit to control a gate current of the IGBT device; and a voltage reader that outputs a control signal to control a variable resistor of the resistor unit to the resistor unit, according to a collector-emitter voltage of the IGBT device.

Preferably, the resistor unit may include a variable resistor unit including variable resistors; and a fixed-resistor unit including fixed-resistors.

Preferably, the variable resistor unit may receive the control signal and changes resistance of the variable resistors.

Preferably, the variable resistor unit may include a plurality of switches and resistors corresponding to the plurality of switches, and provide resistance that is varied by making the plurality of switches open or closed.

Preferably, the fixed-resistor unit may include a first resistor and a second resistor, the resistors being connected in parallel, and the variable resistor unit may include a first switch that is connected to the first resistor in parallel, a third resistor that is connected to the first switch in series, a second switch that is connected to the second resistor in parallel, and a fourth resistor that is connected to the second switch in series.

Preferably, the voltage reader may set a reference voltage.

Preferably, the voltage reader may monitor a collector-emitter voltage of the IGBT device, and increase a gate input current of the IGBT device by making the first switch closed when the collector-emitter voltage is less than the reference voltage (value).

Preferably, the voltage reader may monitor the collector-emitter voltage of the IGBT device, and decrease a gate input current of the IGBT device by making the second switch open when the collector-emitter voltage is greater than the reference voltage (value).

Preferably, the switching gate driver may further include a totem-pole circuit that receives a signal from a gate driver and provide a gate signal of the IGBT device.

The present disclosure has an advantage effect in that since the gate driver makes a gate resistor variable according to the collector-emitter voltage Vice of the IGBT device and suppresses a spike voltage of the collector-emitter voltage of the IGBT device occurring when the IGBT device is turned off, it is possible to reduce a switching loss by shortening a switching time compared with that of a gate driver designed with a fixed-gate resistor RG.

The present disclosure has another advantageous effect in that, it is possible to reduce a voltage rated capacitance of the IGBT by suppressing an IGBT spike voltage of a collector-emitter voltage of the IGBT device, it becomes easy to design a snubber circuit to suppress an IGBT spike voltage by suppressing an IGBT spike voltage of a collector-emitter of the IGBT device, and it becomes easy to design a heat dissipation of an IGBT device by reducing a switching loss when an IGBT device of a collector-emitter voltage Vice of an IGBT device is turned off.

BRIEF DESCRIPTION OF THE DRAWINGS

The accompanying drawings, which are included to provide a further understanding of the disclosure and are incorporated in and constitute a part of this application, illustrate embodiments of the disclosure and together with the description, serve to explain the principle of the disclosure. In the drawings.

DETAILED DESCRIPTION OF THE PREFERRED EMBODIMENTS

Hereinafter, the most preferred embodiment of the present disclosure is given with reference to the accompanying drawings in order to describe the technical idea of the present disclosure to the extent that those skilled in the art can embody the technical idea of the present disclosure with ease.

Figure 1:
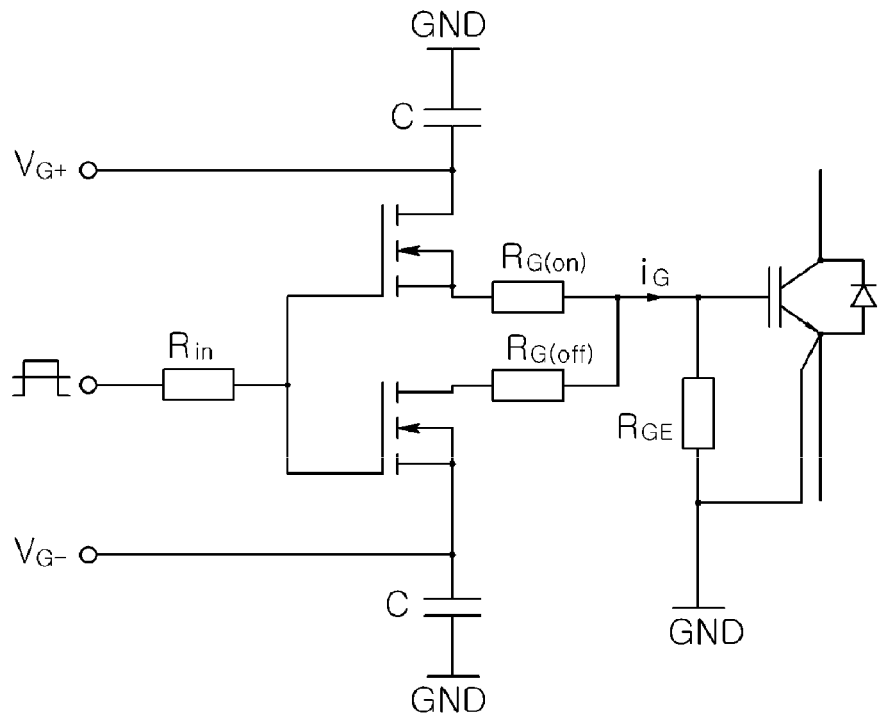
FIG. 1 is a circuit diagram illustrating a gate driver.
Figure 2:
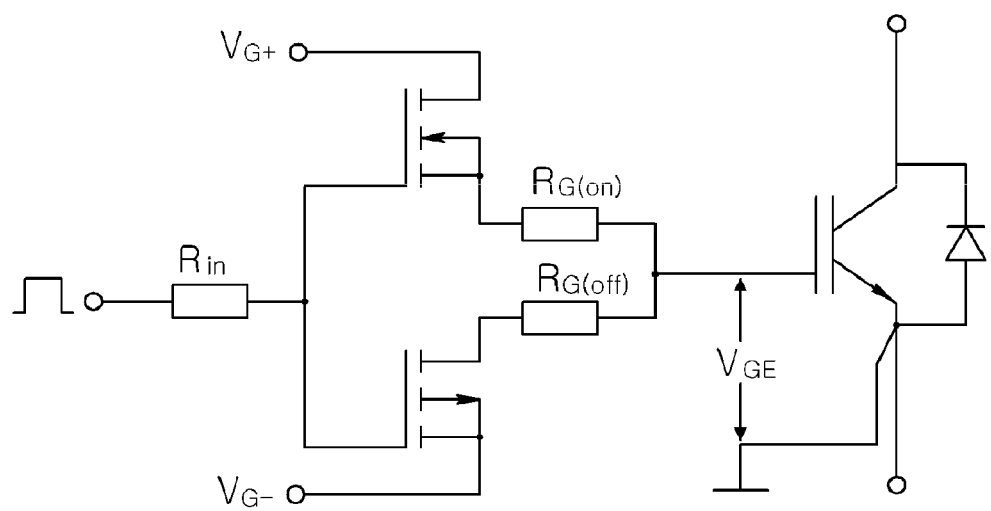
FIGS. 2 to 5 are circuit diagrams illustrating a variety of embodiments of the gate driver illustrated in FIG. 1.
Figure 3:
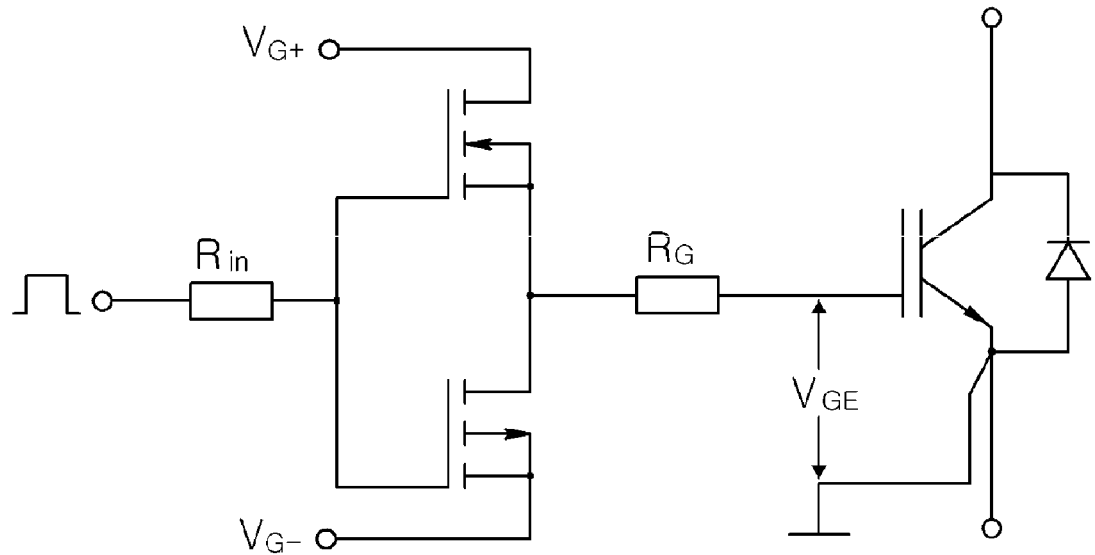
Figure 4:
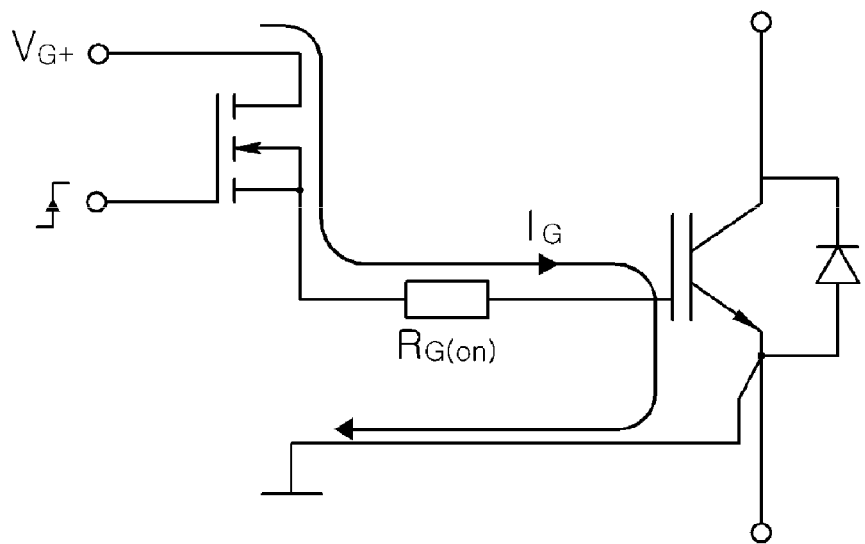
Figure 5:
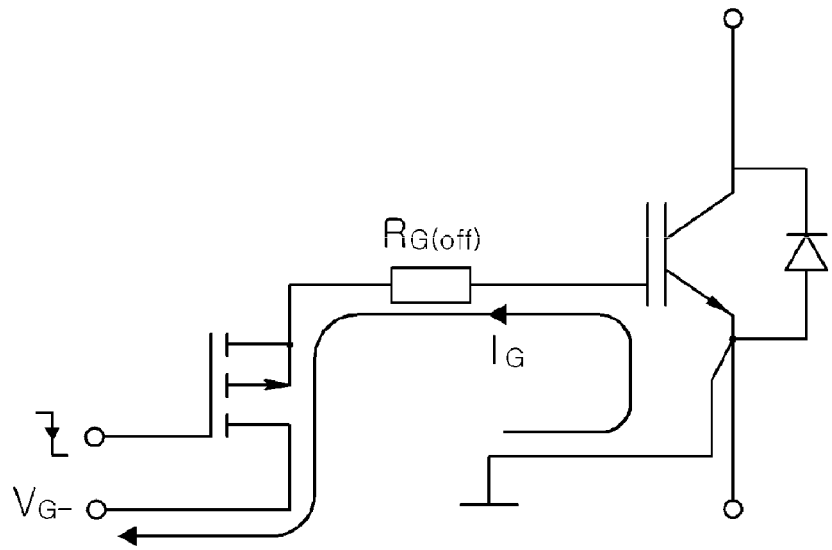
Figure 6:
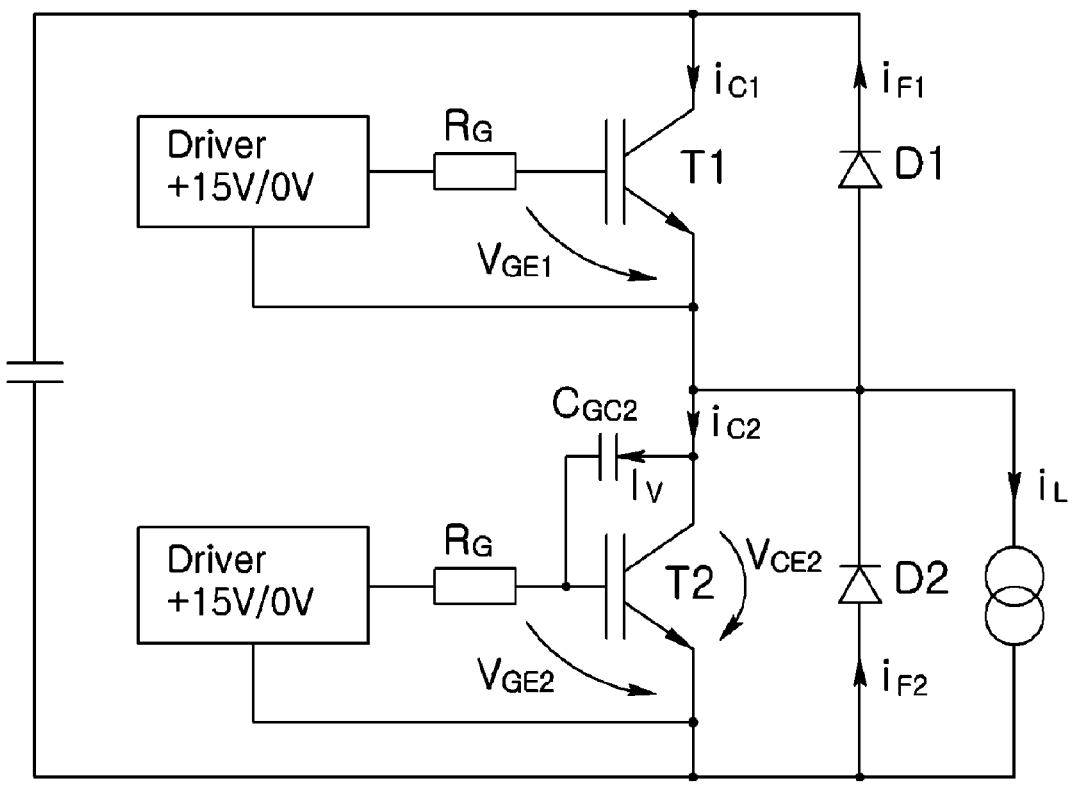
FIG. 6 is a constructional diagram of an IGBT gate driver in an inverter system.
Figure 7:
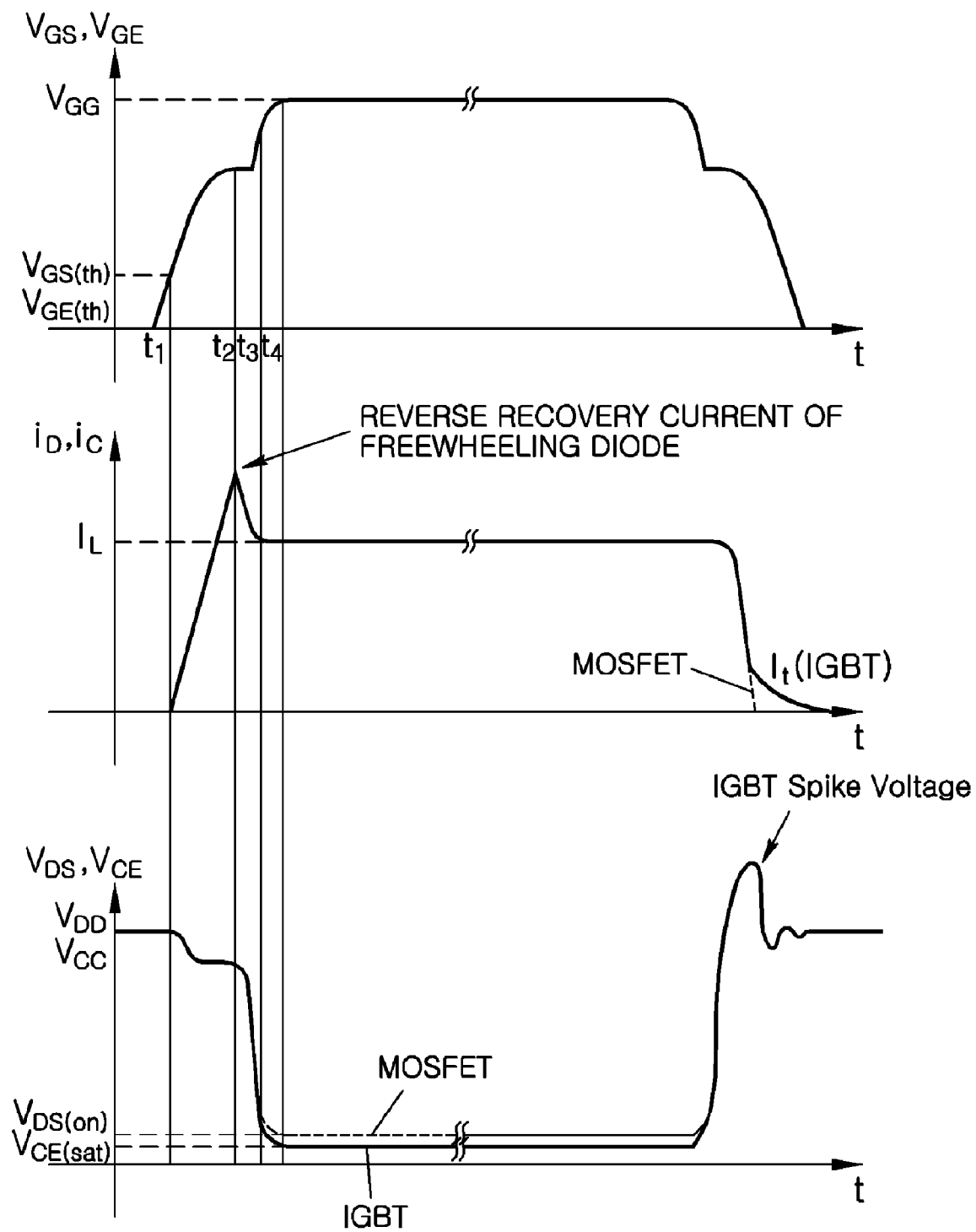
FIG. 7 is a wave form diagram illustrating operational characteristics of IGBT device and MOS FET device.
Figure 8:
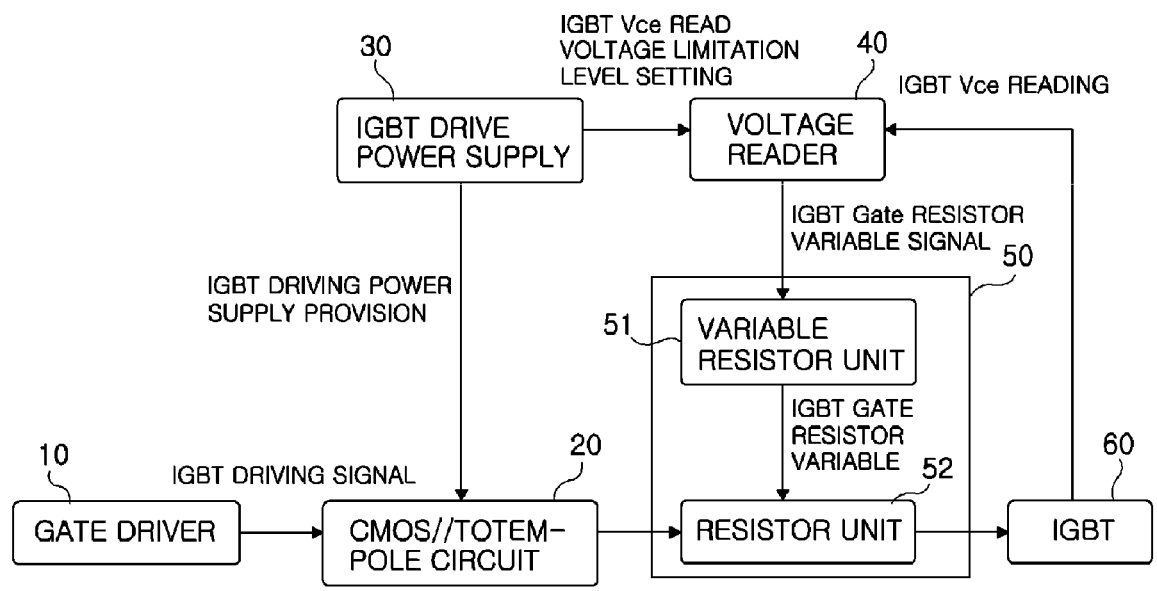
FIG. 8 is a block diagram illustrating a switching gate driver according to an embodiment of the present disclosure.
Figure 9:
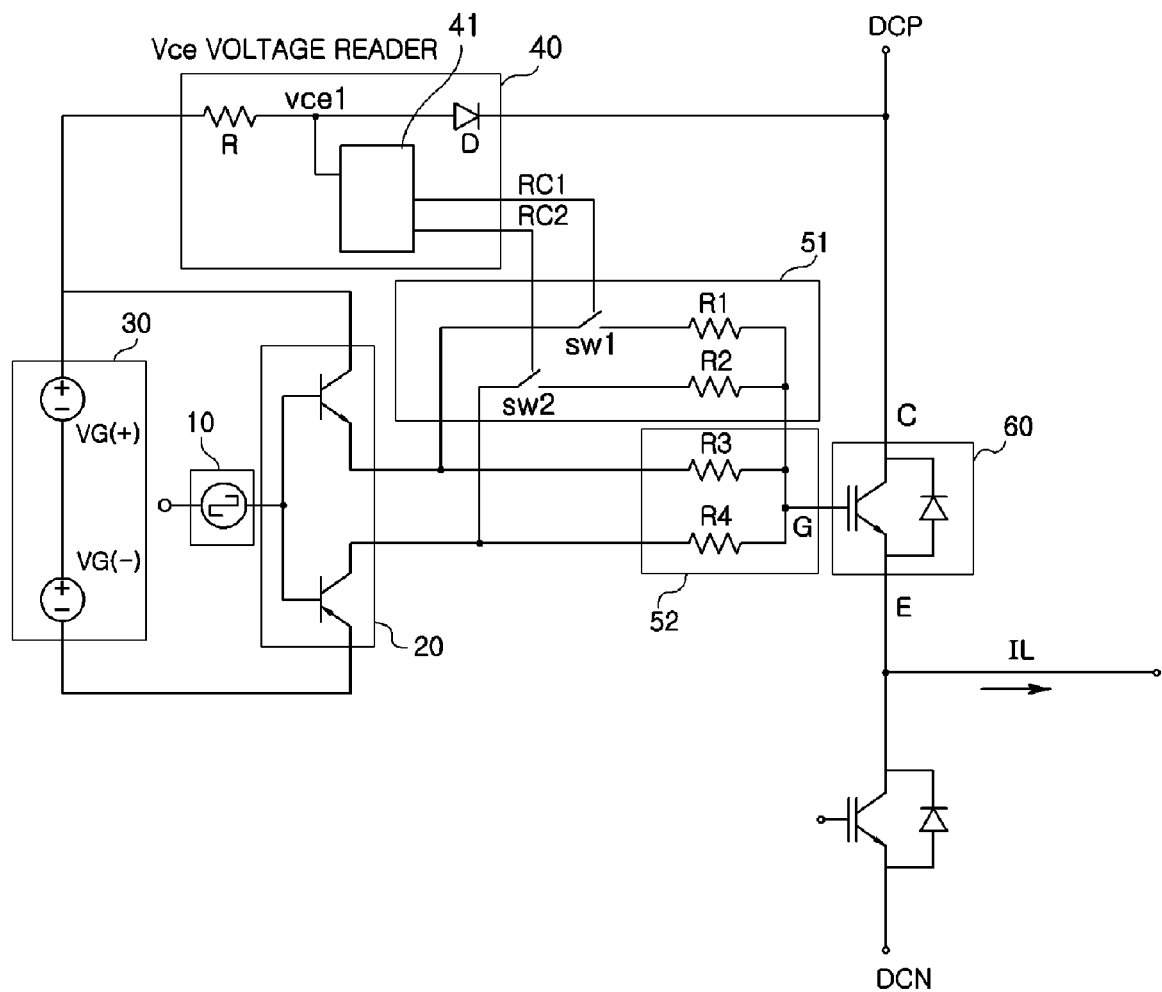
FIG. 9 is a circuit diagram of a switching gate driver illustrated in FIG. 8.
Figure 10:
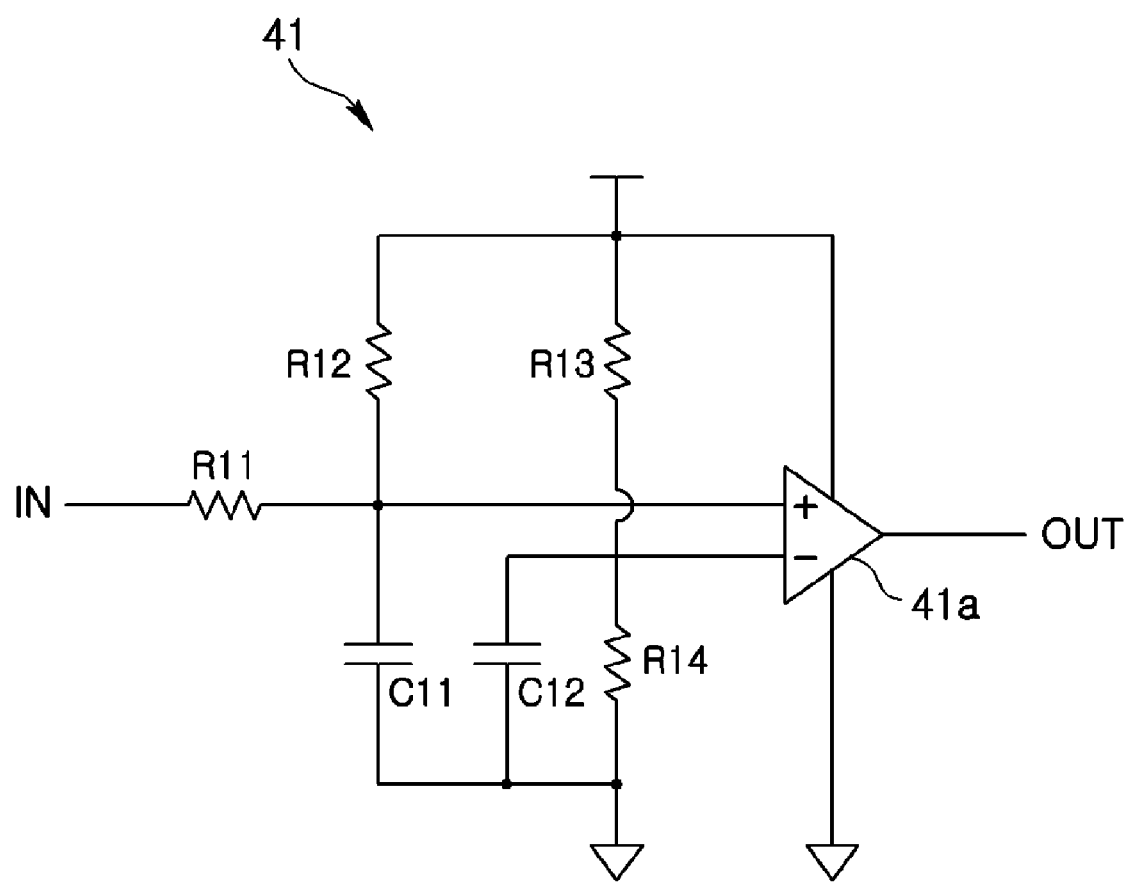
FIG. 10 is a circuit diagram illustrating an embodiment of a voltage detection circuit included in a voltage reader.
Figure 11:
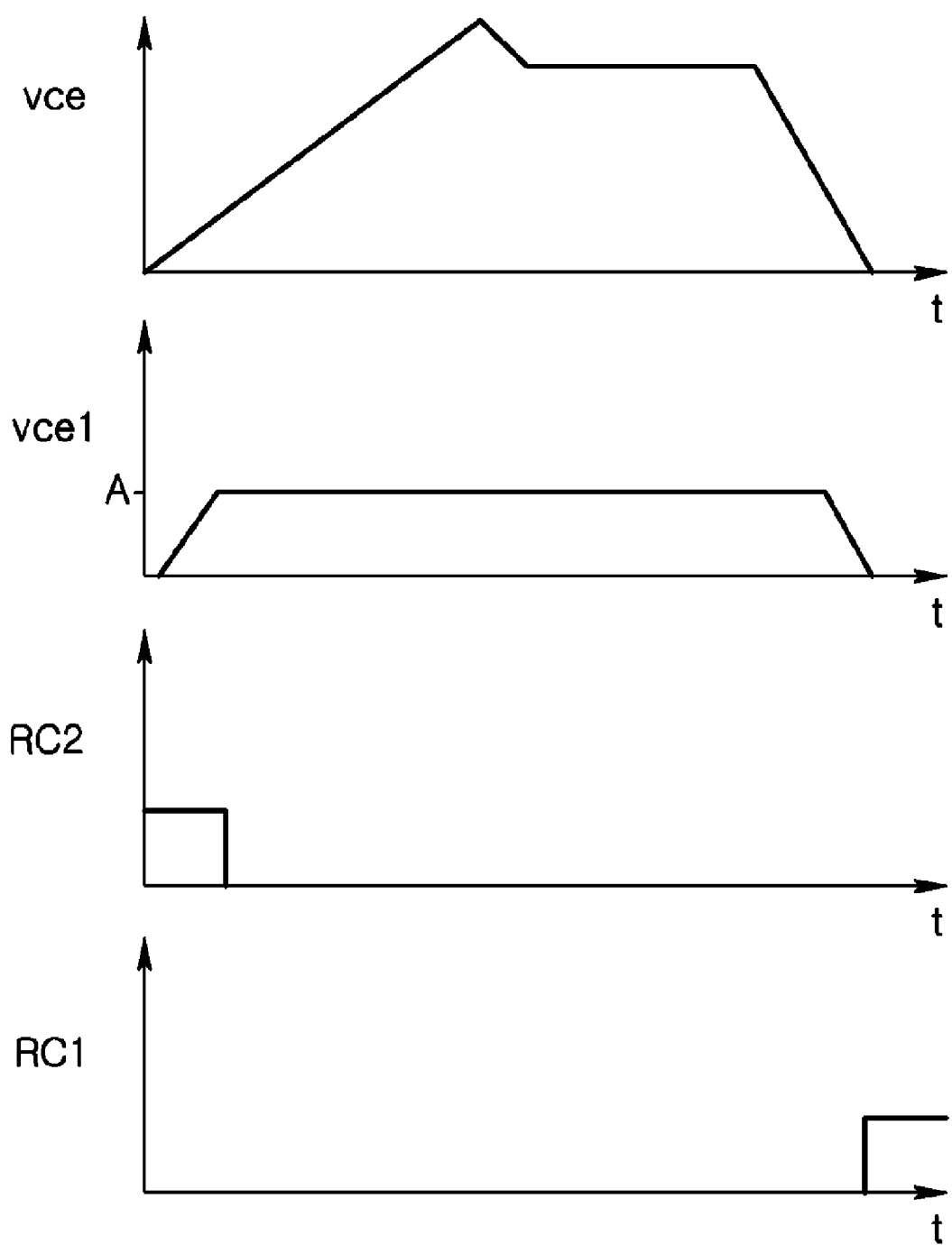
FIG. 11 is a wave form diagram illustrating an operational state of each signal illustrated in FIG. 9.
Figure 12:
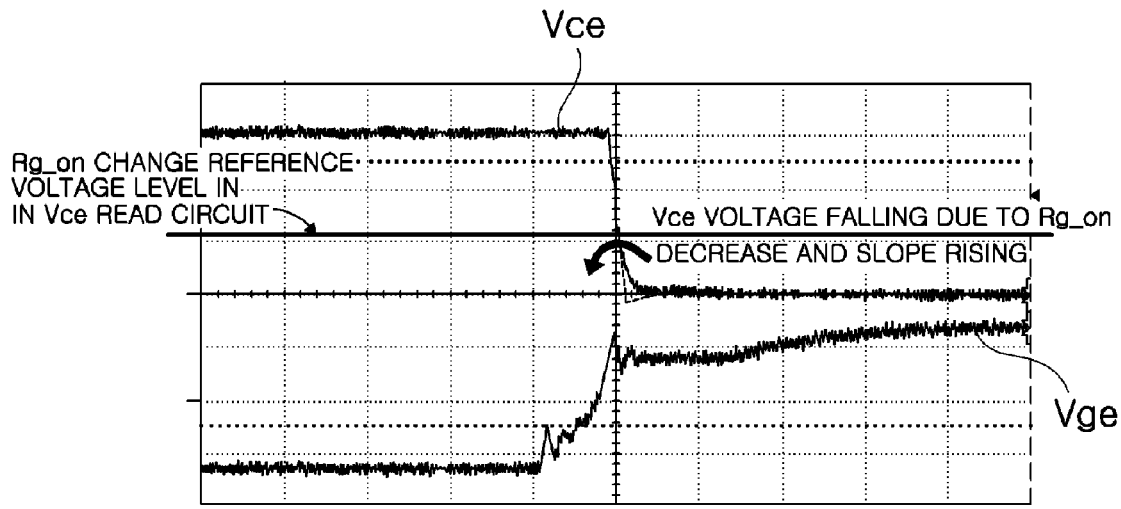
FIGS. 12 and 13 are wave form diagrams illustrating operations of the switching gate driver illustrated in FIG. 9.
Figure 13:
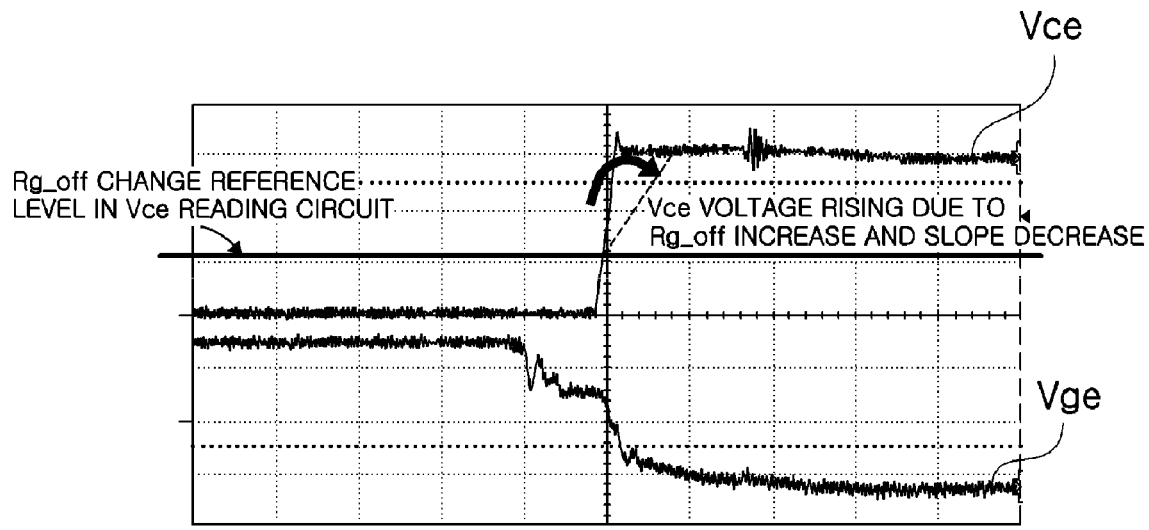

FIG. 6 is a constructional diagram of an IGBT gate driver in an inverter system. FIG. 7 is a wave form diagram illustrating operational characteristics of IGBT device and MOS FET device. FIG. 8 is a block diagram illustrating a switching gate driver according to an embodiment of the present disclosure. FIG. 9 is a circuit diagram of a switching gate driver illustrated in FIG. 8. FIG. 10 is a circuit diagram illustrating an embodiment of a voltage detection circuit included in a voltage reader. FIG. 11 is a wave form diagram illustrating an operational state of each signal illustrated in FIG. 9. FIGS. 12 and 13 are wave form diagrams illustrating operations of the switching gate driver illustrated in FIG. 9.

FIGS. 6 and 7 illustrate switching characteristics of a gate driver of an IGBT device in an inverter system. While a load current IL flows through an IGBT device T1 as illustrated in FIG. 6, if the IGBT device T1 is turned off, the load current IL flows through a reverse diode D2 of the IGBT device T2. At this time, a spike voltage of the IGBT device is generated on both ends of the collector-emitter of the IGBT device T1 by a current change speed (di/dt) of the load current and a parasitic inductance on a path of the inverter load current IL.

While the load current IL flows through the reverse diode D2 of the IGBT device T2, if the IGBT device T1 is turned on, the load current IL flows through the IGBT device T1 and a reverse recovery current of a freewheeling diode flows in the reverse diode D2 of the IGBT device T2 according to a reverse recovery characteristic of a diode. The reverse recovery current of the freewheeling diode in the device D2 overlaps with the load current IL that flows through the IGBT device T1 to be appeared.

The present disclosure relates to a gate driver capable of reducing an IGBT spike voltage occurring when switching an IGBT device and a reverse recovery current of a freewheeling diode while securing turn on and turn off time of an appropriate IGBT device, by changing a gate resistor RG according to a collector-emitter voltage of the IGBT device at turn-on or turn-off operation of the IGBT device.

The present disclosure may be applied to a field where a power switching device is used including an IGBT device and a MOSFET device, as well as an inverter. The present disclosure may suppress a spike voltage of an IGBT device of a collector-emitter voltage Vce of the IGBT device occurring when the IGBT device is turned off, and a reverse recovery current of a freewheeling diode occurring when the IGBT device is turned on, by making a gate resistance variable according to a collector-emitter voltage Vce of the IGBT device. Further, the gate driver of the present disclosure has shorter switching time than that of a gate driver designed with a fixed gate resistance RG that suppresses a spike voltage of the IGBT device of the same IGBT collector-emitter voltage Vce and a reverse recovery current of a freewheeling diode and then can reduce a switching loss.

Further, according to the present disclosure, it is possible to reduce voltage and current rated capacitances of the IGBT by suppressing the spike voltage of the IGBT device of the collector-emitter voltage Vce of the IGBT device and a reverse recovery current of the freewheeling diode and it is easy to design a snubber circuit to suppress the spike voltage when changing an operation of the IGBT device. Further, since turn-on and turn-off switching change time of the IGBT device is reduced compared with that of the gate driver designed with a fixed gate resistance RG that suppresses a spike voltage of the IGBT device of the collector-emitter voltage Vce of the same IGBT device and a reverse recovery current of a freewheeling diode, a switching loss becomes small.

As illustrated in FIG. 8, a gate driver according to the present embodiment includes a totem-pole circuit 20, an IGBT driving power supply 30, a voltage reader 40 and a resistor unit 50.

The totem-pole circuit 20 is provide with an IGBT driving signal that is provide from a gate driver driving chip 10 and provides a variable resistor unit 50 with it. An IGBT driving power supply 30 provides a predetermined IGBT driving voltage and sets a suggested level of an IGBT read voltage Vce. The voltage reader 40 is provided with an IGBT read voltage Vce that is provided from an IGBT device 60 and provides an IGBT gate resistance variable signal. The resistor unit 50 includes a fixed resistor unit 52 having a fixed resistance value and a variable resistor unit 51 providing a variable resistance value.

FIG. 9 illustrates a case that each block illustrated in FIG. 8 is embodied as an actual circuit, and uses the same reference symbol for the sake of convenience. Here, the variable resistor unit 51 includes 2 resistors and 2 switches, and turns switch included on or off in response to a resistance variable signal provided by the voltage reader 40. Here, the voltage reader 40 may be variously constructed, including a resistor R, a diode D and a voltage detection circuit 41.

An operation of a gate driver according to the present embodiment may be divided into a turn on operation and a turn off operation of the IGBT device.

FIG. 7 illustrates operational wave forms of an IGBT gate voltage Vge, an IGBT collector current IC and an IGBT collector-emitter voltage Vce that occur when switching the IGBT device. A turn on operation of the IGBT device may be divided into ③ stop state (section 0 to t1) ③ drain current rising section (section t1 to t2) ③ Turn On section (section t2 to t3) ③ resistance characteristic area (section t3 to t4), and a change of an IGBT collector-emitter voltage may occur at the ③ Turn On section. A turn off operation of the IGBT device occurs in a reverse order of the turn on operation of the IGBT device.

A main operation of the gate driver according to the present disclosure occurs in a change of a switch of the IGBT collector-emitter voltage Vce occurring at the ③ Turn On section. The collector-emitter voltage Vce of the IGBT device becomes an input voltage vce1 and is input into the voltage reader 40 through a diode D for reading and a resistor R for reading illustrated in FIG. 9. At this time, the magnitude of the input voltage vce1 that is input into the voltage reader 40 by the diode D for reading is limited to the magnitude of the IGBT driving power supply VG(+) and the voltage read circuit 41 continues to receive the input voltage vce1 in which the IGBT collector-emitter voltage Vce is limited to the magnitude of VG(+).

FIG. 10 is a circuit diagram illustrating an embodiment of a voltage detection circuit included in a voltage reader. The voltage read circuit 41 may be constructed of a level detector. The voltage read circuit 41 receives the input voltage Vce1 as an input signal and provides control signals RC1 and RC2 as output signals OUT. The voltage read circuit 41 serves to provide the control signals RC1 and RC2 when the IGBT collector-emitter voltage Vce changes to more than or less than a predetermined voltage level. The voltage read circuit 41 may be embodied with various circuits such as transistor, OP amplifier and comparator. Here, the voltage read circuit 41 generates a high or low level control signal RC1 or RC2 when the voltages input through the diode D for reading and resistor R for reading change to more than or less than a predetermined level as described above.

FIG. 11 is a wave form diagram illustrating an operational state of each signal illustrated in FIG. 10.

FIG. 11 illustrates wave forms of the IGBT collector-emitter voltage Vce and input signal Vce1 of the voltage read circuit 41 included in the voltage reader 40 and control signals RC1 and RC2.

Subsequently, the voltage reader 40 at an turn-on operation of the IGBT device increases a gate charge current of the IGBT device by turning the switches SW1 and SW2 on so as to operate the resistors R1 and R2 included in the variable resistor unit 51 of the resistor unit 50 when the IGBT collector-emitter voltage Vce becomes equal to or less than a predetermined change reference voltage that is set in the voltage reader 40.

When the IGBT gate charge current increases, an IGBT current change speed increases so that a current change is accelerated by controlling the control signals RC1 and RC2 designed in order to suppress a reverse recovery current of a freewheeling diode. Since an increase of the IGBT gate charge current by making the IGBT gate resistor variable occurs when the IGBT collector-emitter voltage Vce is changed, an IGBT switching loss calculated by multiplying an IGBT current by the IGBT collector-emitter voltage Vce at the IGBT switching decreases compared with that of the gate drive designed with a fixed gate resistor RG that suppresses a reverse recovery current of the same freewheeling diode. Accordingly, it is possible to decrease a current rated capacitance of the IGBT by suppressing a reverse recovery current of the freewheeling diode when the IGBT device is turned on.

Since the IGBT current change speed is faster than that of the gate drive designed with the fixed gate resistor RG that suppresses the reverse recovery current of the same freewheeling diode, it is possible to design a dead time to be small.

As illustrated in FIG. 12, the voltage reader 40 at a turn-off operation of the IGBT decreases a gate discharge current of the IGBT device by making switches SW1 and SW2 of the variable resistor unit 51 of the resistor unit 50 open when the IGBT collector-emitter voltage Vce becomes more than a predetermined change reference voltage set in the voltage reader 40. When a gate discharge current of the IGBT device decreases, an IGBT current change speed decreases so that an IGBT spike voltage decreases, the voltage being appeared at the IGBT collector-emitter voltage Vce when the IGBT is turned off.

Since an IGBT discharge current decrease by the variable resistor unit 51 occurs when the IGBT collector-emitter voltage is changed, a switching loss of the IGBT device calculated by multiplying an IGBT current by an IGBT collector-emitter voltage Vce at an IGBT switching decreases compared with that of the gate drive designed with a fixed gate resistor RG that suppresses an IGBT spike voltage of the same IGBT collector-emitter voltage Vce. Accordingly, it is possible to reduce an IGBT voltage rated capacitance by suppressing an IGBT spike voltage of the IGBT collector-emitter voltage Vce when the IGBT device is turned off.

Further, an IGBT current change speed is faster than that of the gate drive designed with a fixed gate resistor RG that suppresses an IGBT spike voltage of the same IGBT collector-emitter voltage Vce, the dead time may be designed to be short.

The gate drive according to the present embodiment makes a switching time short by making the gate resistor RG variable according to the collector-emitter voltage Vce of the IGBT device and suppressing a spike voltage of the collector-emitter voltage Vce of the IGBT device occurring when the IGBT device is turned off, compared with that of the gate drive designed with a fixed gage resistor RG that suppresses the IGBT spike voltage of the collector-emitter voltage Vce of the same IGBT device, so that a switching loss is reduced.

Further, a voltage rated capacitance of the IGBT is reduced by suppressing an IGBT spike voltage of a collector-emitter voltage Vce of the IGBT device. Further, it becomes easy to design a snubber circuit to suppress an IGBT spike voltage by suppressing an IGBT spike voltage of a collector-emitter voltage Vce of IGBT device. Further, it becomes easy to design a hear radiation of an IGBT device by reducing a switching loss when the IGBT device of the collector-emitter voltage Vce of the IGBT is turned on.

Further, it is possible to reduce a current rated capacitance of the IGBT by suppressing a reverse recovery current of a freewheeling diode. Further, it becomes easy to design a hear radiation of the IGBT device by reducing a switching loss when the IGBT device is turned on. When the IGBT device drives a high voltage, it is possible to detect the IGBT collector-emitter voltage Vce within a limited voltage scope. Further, the present disclosure may be embodied at relatively low cost by not using expensive parts such as transformer and isolation amplifier but using a diode.

Further, it is possible to reduce the dead time of the IGBT device by shortening a switching change time. Even when the IGBT device drives a high voltage, it becomes easy to design a circuit by reading the IGBT collector-emitter voltage Vce within a voltage scope of an IGBT device drive power supply VG(+) using a diode in the voltage reader.

Further, the present disclosure may be variously applied as follows.

For example, it may be applied by exchanging an IGBT voltage read point used in the present disclosure with a gate-emitter of the IGBT device in a collector-emitter of the IGBT device. Even when constructed as described above, it is possible to make the same effect as the above embodiment and to expand a voltage read scope to ① stop state ② drain current rise section ③ Turn On section ④ resistance characteristic area.

Further, by dividing the collector-emitter voltage Vce of the IGBT device and receiving the voltage within an IGBT drive power supply VG(+) voltage using a Vce detector, it is possible to expand a gate resistor RG change level in the Vce detection circuit to entire voltage area of the IGBT collector-emitter voltage Vce.

Further, when constructing a gate resistor RG change operation circuit in the detection circuit of the collector-emitter voltage Vce as a differentiator, it is possible to embody a gate resistor RG change operation according to a slope of an IGBT collector-emitter voltage Vce.

Hereinbefore, while the embodiments of the present disclosure are described, they are exemplary ones only and one of ordinary skill in the art may recognize that various alterations and modifications that fall within the scope of the present disclosure may be possible. Accordingly, the true technical protection scope of the present disclosure should be defined by the following claims.

What is claimed is:

1. A switching gate driver of an insulated gate bipolar transistor) (IGBT) device, the switching gate driver comprising:
a resistor unit configured to control a gate current of the IGBT device, the resistor unit comprising a fixed-resistor unit and a variable resistor unit connected in parallel with the fixed-resistor unit, the variable resistor unit comprising a plurality of switches and resistors connected in serial with the plurality of switches; and
a voltage reader configured to control the variable resistor unit according to a collector-emitter voltage of the IGBT device, wherein the voltage reader turns the plurality of switches on when the collector-emitter voltage goes less than a first reference voltage at a turn-on operation of the IGBT device, and the voltage reader turns the plurality of switches off when the collector-emitter voltage goes greater than a second reference voltage at a turn-off operation of the IGBT device.

2. The switching gate driver according to claim 1, wherein the fixed-resistor unit comprises a first resistor and a second resistor connected in parallel with the first resistor.

3. The switching gate driver according to claim 2, wherein the variable resistor unit comprises a first switch, a second switch, a third resistor and a fourth resistor where the first switch and with the third resistor are connected in serial and the second switch and the fourth resistor are connected in serial.

4. The switching gate driver according to claim 3, wherein a first serial connection of the first switch and the third resistor and a second serial connection of the second switch and the fourth resistor are connected in parallel.

5. The switching gate driver according to claim 1, wherein the voltage reader comprises a fifth resistor, a diode and a voltage detector.

6. The switching gate driver according to claim 5, wherein the voltage detector includes a level detector.

* * * * *